(12) United States Patent
Smith et al.

(10) Patent No.: US 7,369,597 B2
(45) Date of Patent: May 6, 2008

(54) LASER OUTPUT LIGHT PULSE STRETCHER

(75) Inventors: Scot T. Smith, Winter Springs, FL (US); Alexander I. Ershov, San Diego, CA (US); Alexei Lukashev, San Diego, CA (US)

(73) Assignee: Cymer, Inc., San Diego, CA (US)

( * ) Notice: Subject to any disclaimer, the term of this patent is extended or adjusted under 35 U.S.C. 154(b) by 0 days.

(21) Appl. No.: 10/847,799

(22) Filed: May 18, 2004

(65) Prior Publication Data

US 2005/0105579 A1  May 19, 2005

Related U.S. Application Data

(63) Continuation-in-part of application No. 10/712,545, filed on Nov. 13, 2003, now Pat. No. 6,928,093.

(51) Int. Cl.
*H01S 3/083* (2006.01)

(52) U.S. Cl. .......................... 372/94; 372/108

(58) Field of Classification Search ................ 372/22, 372/98, 104, 34, 103, 107, 94, 108
See application file for complete search history.

(56) References Cited

U.S. PATENT DOCUMENTS

| | | | | |
|---|---|---|---|---|
| 3,919,663 A * | 11/1975 | Caruolo et al. | ............. | 372/107 |
| 4,223,279 A | 9/1980 | Bradford, Jr. et al. | ..... | 331/94.5 |
| 4,455,658 A | 6/1984 | Sutter et al. | .................... | 372/38 |
| 4,602,372 A * | 7/1986 | Sasaki et al. | .................. | 372/58 |
| 4,757,511 A * | 7/1988 | Klingel et al. | ................. | 372/58 |
| 4,930,138 A * | 5/1990 | Opower | ....................... | 372/95 |
| 4,959,840 A | 9/1990 | Akins et al. | ................... | 372/57 |
| 5,023,884 A | 6/1991 | Akins et al. | ................... | 372/57 |
| 5,025,445 A * | 6/1991 | Anderson et al. | ............. | 372/20 |
| 5,025,446 A | 6/1991 | Kuizenga | ...................... | 372/21 |
| 5,157,684 A * | 10/1992 | Benda et al. | ................. | 372/95 |
| 5,189,678 A | 2/1993 | Ball et al. | ...................... | 372/28 |
| 5,313,481 A | 5/1994 | Cook et al. | .................... | 372/37 |
| 5,315,611 A | 5/1994 | Ball et al. | ...................... | 372/56 |
| 5,359,620 A | 10/1994 | Akins | ........................... | 372/58 |
| 5,448,580 A | 9/1995 | Birx et al. | ..................... | 372/38 |
| 5,471,965 A | 12/1995 | Kapich | ........................ | 123/565 |
| 5,661,748 A * | 8/1997 | Zahavi et al. | ............... | 372/108 |
| 5,852,621 A | 12/1998 | Sandstrom | .................... | 372/25 |
| 5,863,017 A | 1/1999 | Larson et al. | ............ | 248/176.1 |
| 5,953,360 A | 9/1999 | Vitruk et al. | .................. | 372/87 |
| 5,978,394 A | 11/1999 | Newman et al. | ............... | 372/32 |
| 6,005,879 A | 12/1999 | Sandstrom et al. | ........... | 372/25 |
| 6,016,325 A | 1/2000 | Ness et al. | ..................... | 372/38 |
| 6,018,537 A | 1/2000 | Hofmann et al. | .............. | 372/25 |
| 6,028,880 A | 2/2000 | Carlesi et al. | ................ | 372/58 |

(Continued)

*Primary Examiner*—Minsun Oh Harvey
*Assistant Examiner*—Tuan N. Nguyen
(74) *Attorney, Agent, or Firm*—William C. Cray

(57) ABSTRACT

Providing a high peak power short pulse duration gas discharge laser output pulse comprises a pulse stretcher a laser output pulse optical delay initiating optic diverting a portion of the output laser pulse into an optical delay having an optical delay path and comprising a plurality of confocal resonators in series aligned to deliver an output of the optical delay to the laser output pulse optical delay initiating optic. The plurality of confocal resonators comprises four confocal resonators comprising a twelve pass four mirror arrangement. An apparatus and method may comprise a plurality, e.g., two pulse stretchers in series and may include spatial coherency metrology.

65 Claims, 5 Drawing Sheets

U.S. PATENT DOCUMENTS

| | | | |
|---|---|---|---|
| 6,067,311 A | 5/2000 | Morton et al. | 372/57 |
| 6,094,448 A | 7/2000 | Fomenkov et al. | 372/102 |
| 6,104,735 A | 8/2000 | Webb | 372/37 |
| 6,109,574 A | 8/2000 | Pan et al. | 248/176.1 |
| 6,128,323 A | 10/2000 | Myers et al. | 372/38 |
| 6,151,349 A | 11/2000 | Gong et al. | 372/58 |
| 6,164,116 A | 12/2000 | Rice et al. | 73/1.72 |
| 6,192,064 B1 | 2/2001 | Algots et al. | 372/99 |
| 6,208,674 B1 | 3/2001 | Webb et al. | 372/57 |
| 6,208,675 B1 | 3/2001 | Webb | 372/58 |
| 6,212,211 B1 | 4/2001 | Azzola et al. | 372/23 |
| 6,219,368 B1 | 4/2001 | Govorkov | 372/59 |
| 6,240,117 B1 | 5/2001 | Gong et al. | 372/58 |
| 6,314,119 B1 | 11/2001 | Morton | 372/57 |
| 6,317,447 B1 | 11/2001 | Partlo et al. | 372/57 |
| 6,330,261 B1 | 12/2001 | Ishihara et al. | 372/38.1 |
| 6,389,045 B1 * | 5/2002 | Mann et al. | 372/25 |
| 6,414,979 B2 | 7/2002 | Ujazdowski et al. | 372/87 |
| 6,442,186 B1 * | 8/2002 | Vitruk | 372/95 |
| 6,477,193 B2 | 11/2002 | Oliver et al. | 372/58 |
| 6,493,374 B1 | 12/2002 | Fomenkov et al. | 372/102 |
| 6,535,531 B1 | 3/2003 | Smith et al. | 372/25 |
| 6,556,612 B2 | 4/2003 | Ershov et al. | 372/103 |
| 6,618,421 B2 | 9/2003 | Das et al. | 372/55 |
| 6,693,939 B2 | 2/2004 | Klene et al. | 372/58 |
| 6,704,340 B2 | 3/2004 | Ershov et al. | 372/58 |
| 6,782,031 B1 | 8/2004 | Hofmann et al. | |
| 6,856,639 B2 * | 2/2005 | Dutov et al. | 372/61 |
| 7,035,012 B2 * | 4/2006 | Govorkov et al. | 359/618 |

* cited by examiner

LASER OUTPUT LIGHT PULSE STRETCHER

RELATED APPLICATIONS

The present application is a continuation-in-part of U.S. patent application Ser. No. 10/712,545 filed on Nov. 13, 2003, now U.S. Pat. No. 6,928,093 entitled LONG DELAY AND HIGH TiS PULSE STRETCHER and related to U.S. Published Patent Application No. 2002/0154671A1, published on Oct. 24, 2002 with inventors Knowles et al., entitled LINE SELECTED F2 TWO CHAMBER LASER SYSTEM, based upon an application Ser. No. 10/056,619, filed on Jan. 23, 2002, and of U.S. Published Patent Application No. 2003/0138019A1, published on Jul. 24, 2003, with inventors Rylov et al., entitled TWO CHAMBER F2 LASER SYSTEM WITH F2 PRESSURE BASED LINE SELECTION, based on an application Ser. No. 10/243,102, filed on Sep. 13, 2002, and to U.S. Pat. Nos. 6,067,311, entitled EXCIMER LASER WITH PULSE MULTIPLIER, issued to Morton et al. on May 23, 2000, based upon an application Ser. No. 09/148,514, filed on Sep. 4, 1998, and U.S. Pat. No. 6,314,119, entitled EXCIMER LASER WITH PULSE AND BEAM MULTIPLIER, issued to Morton on Nov. 6, 2001, based upon an application Ser. No. 09/183,860, filed on Oct. 30, 1998, and U.S. Pat. No. 6,535,531, entitled GAS DISCHARGE LASER WITH PULSE MULTIPLIER, issued to Smith et al. on Mar. 18, 2003, based on application Ser. No. 10/006,913, filed on Nov. 29, 2001, and U.S. Pat. No. 6,625,191, entitled VERY NARROW BAND, TWO CHAMBER, HIGH REP RATE GAS DISCHARGE LASER SYSTEM, issued to Knowles et al. on Sep. 23, 2003, based upon an application Ser. No. 10/012,002 filed on Nov. 30, 2001, and U.S. Pat. No. 6,690,704, entitled CONTROL SYSTEM FOR A TWO CHAMBER GAS DISCHARGE LASER, issued to Fallon et al. on Feb. 10, 2004, based on an application Ser. No. 10/210,761, filed on Jul. 31, 2002, and U.S. Pat. No. 6,693,939, entitled LASER LITHOGRAPHY LIGHT SOURCE WITH BEAM DELIVERY, issued to Kiene et al. on Feb. 17, 2004, based on an application Ser. No. 10/141,216, filed on May 7, 2002, and U.S. Pat. No. 6,704,339 entitled LITHOGRAPHY LASER WITH BEAM DELIVERY AND BEAM POINTING CONTROL, issued to Lublin et al. on Mar. 9, 2004, based on an application Ser. No. 10/233,253, filed on Aug. 30, 2002, and U.S. Pat. No. 6,704,340, entitled LITHOGRAPHY LASER SYSTEM WITH IN-PLACE ALIGNMENT TOOL, issued to Ershov et al. on Mar. 9, 2004, based on an application Ser. No. 10/255,806, filed on Sep. 25, 2002, the disclosures of all of which are hereby incorporated by reference.

FIELD OF THE INVENTION

The present invention elates to high peak power short pulse duration gas discharge laser systems, e.g., excimer or other fluorine gas discharge lasers, e.g., molecular fluorine gas discharge laser systems, utilized, e.g., in applications such as integrated circuit lithography, wherein downstream optics may be severely damages or suffer shortened lifetimes due to optical fluence damage mechanisms driven more by peak power than total integrated power of the light passing through the downstream optical elements.

BACKGROUND OF THE INVENTION

It is also known that spatial coherence is a factor in laser light sources, e.g., excimer and other gas discharge laser light sources, e.g., molecular fluorine laser light sources properly performing according to specification in, e.g., the use of such light, e.g., in the DUV range, for, e.g., exposure of photoresists on integrated circuit wafers. The makers of such integrated circuit lithography tools are demanding tighter and tighter specifications for spatial coherence. Some lasers manufactured by applicants' assignee, e.g., XLA lasers, are borderline passing tests for spatial coherence according to current practice and may become even more susceptible to being out of specification in the future as specifications are defined more tightly. In the past the metrology used to define spectral coherence was to, e.g., find a point with maximum interference fringe contrast in the laser beam and use that as a measure of spatial coherence. However this data point does not represent the property of coherence of the whole beam. Applicants have, therefore, determined that a better means of measuring beam spatial coherence is needed and propose such a method in the present application.

SUMMARY OF THE INVENTION

An apparatus and method for providing a high peak power short pulse duration gas discharge laser output pulse is disclosed which may comprise a pulse stretcher which may comprise a laser output pulse optical delay initiating optic diverting a portion of the output laser pulse into an optical delay having an optical delay path and comprising; a plurality of confocal resonators in series aligned to deliver an output of the optical delay to the laser output pulse optical delay initiating optic. The plurality of confocal resonators comprises four confocal resonators comprising a twelve pass four mirror arrangement. Each of the plurality of confocal resonators may comprise a first concave spherical mirror having a radius of curvature and a second concave spherical mirror having the same radius of curvature and separated by the radius of curvature. The pulse stretcher may comprise a first confocal resonator cell which may comprise: a first concave spherical mirror having a radius of curvature receiving an input beam from the laser output pulse optical delay initiating optic comprising the portion of the output laser pulse at a first point on a face of the first concave spherical mirror and generating a first reflected beam; a second concave spherical mirror having the same radius of curvature and separated from the first concave spherical mirror by the radius of curvature and receiving the first reflected beam at a first point on a face of the second concave spherical mirror and generating a second reflected beam incident on a second point on the face of the first concave spherical mirror, the second reflected beam being reflected by the first concave spherical mirror from the second point on the first mirror to form an output beam from the first confocal resonator cell; and, a second confocal resonator cell receiving the output beam of the first confocal resonator cell as an input beam of the second confocal resonator cell. The apparatus and method may form part of a beam delivery unit and may be part of an integrated circuit lithography lights source or an integrated circuit lithography tool. The apparatus and method may comprise a plurality, e.g., two pulse stretchers in series and may include spatial coherency metrology.

DETAILED DESCRIPTION OF PREFERRED EMBODIMENTS

According to aspects of an embodiment of the present invention applicant has designed an optical pulse stretcher for a laser light source, e.g., a gas discharge laser light source, e.g., a KrF or ArF or molecular fluorine gas discharge laser, e.g., for use in integrated circuitry lithography illumination, which has a long optical delay, but is constrained to have a practical physical length, e.g., less than about 8 feet, e.g., in order to be mounted on existing laser frames or contained within a beam delivery unit and fit, e.g., in a fabrication facility clean room sub-floor room. According to aspects of an embodiment of the present invention, the pulse stretcher may be, e.g., a multi-passing system with a minimum number of optics, e.g., four, consistent with proper operation. This, in addition, e.g., minimizes the number of adjustments necessary to align a system, and according to aspects of an embodiment of the present invention the system is designed to allow for a considerable amount of misalignment over systems of the prior art. According to an aspect of an embodiment of the present invention the pulse stretcher comprises, e.g., a unique optical design that produces 12 passes with only 4 mirrors. Such a pulse stretcher is capable of, e.g., an optical pulse stretching having, e.g., an 80 ns delay from a physical length of about 2 meters and a total of 4 mirrors. According to aspects of an embodiment of the present invention also, the pulse stretcher disclosed, e.g., does not suffer the focusing problems of, e.g., a Herriott Cell nor the re-entry and symmetry problems of, e.g., a White Cell.

Figure 1:
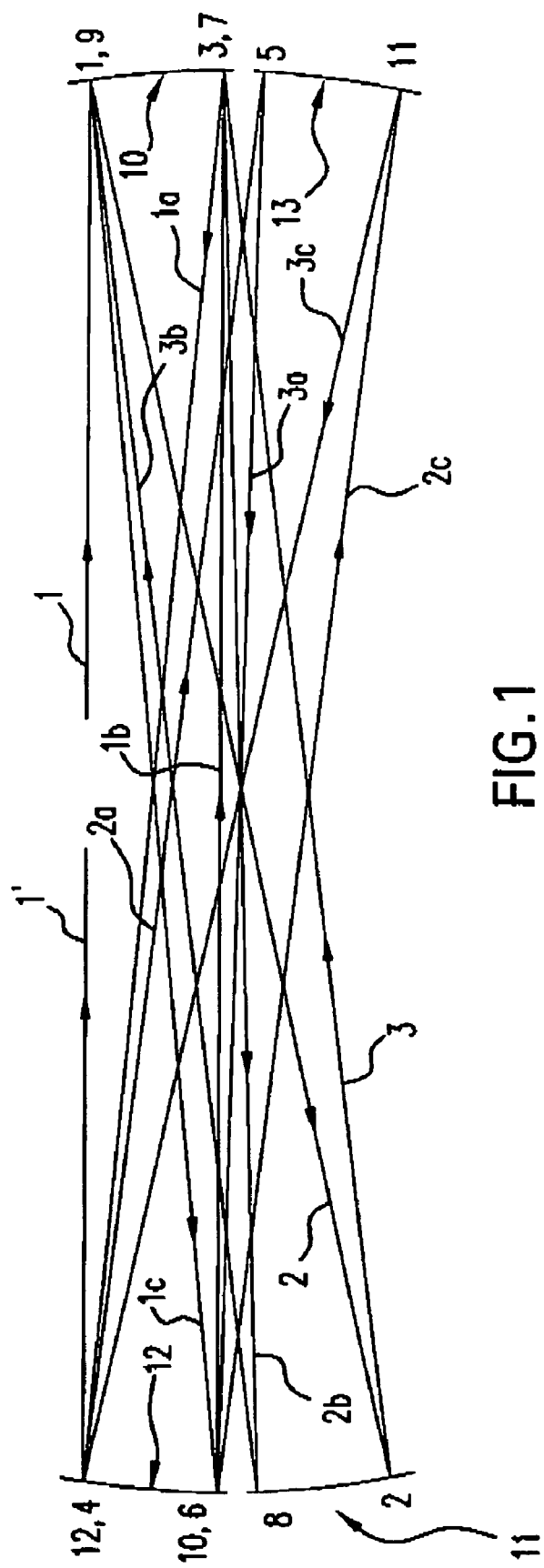
FIG. 1 shows a partially schematic cross-sectional view of a pulse stretcher according to aspects of an embodiment of the present invention.
Figure 2:
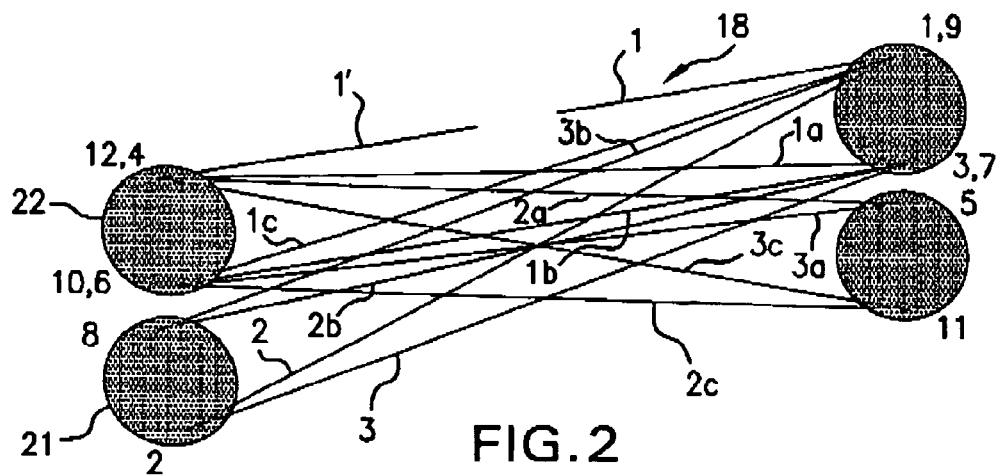
FIG. 2 shows a partially schematic perspective view of the pulse stretcher according to FIG. 1.

What is so remarkable about aspects of an embodiment of the present invention, in addition to its space efficiency is its stability. The design is so stable that it may require no adjustments for alignment. According to aspects of an embodiment of the present invention stability can be derived, e.g., from the fact that the design is essentially 4 confocal resonators, having, e.g., the re-entry characteristic of a confocal resonator. According, e.g., the beam will retrace its path no matter what the angle orientation exists between the two mirrors forming, e.g., the respective confocal resonator, as long as the beam intercepts the respective next mirror in the respective confocal resonator. This concept can be most easily identified by examining one section of the layout as shown in FIGS. 3-6. Turning first to FIGS. 1 and 2, however, there is shown a pulse stretcher 18 according to aspects of an embodiment of the present invention.

The pulse stretcher 18 may comprise, e.g., four focusing mirrors, e.g., concave spherical mirrors 20, 21, 22, 23, which may be, e.g., 10 cm in diameter, e.g., for handling adequately a beam size of e.g., 1.2 cm×1.2 cm. Each of the mirrors 20, 21, 22 and 23 is separated by a radius of curvature of the spherical mirror preceding it in a respective confocal resonator cell and may have, e.g., a radius of curvature of, e.g., about 1.6-2 meters. In operation, e.g., the beam 1 can enter the delay path formed by the mirrors 20, 21, 22, 23 through a beam splitter (not shown in FIGS. 1 and 2 for clarity reasons) and be incident at a first point 1 on the mirror 20. From point 1 on the mirror the reflected beam 2 is incident on point 2 on mirror 21, and from there, the reflected beam 3 returns to mirror 20 at point three. From point 3 on mirror 20, the reflected beam 1a is incident on point 4 on mirror 22 and from there the reflected beam 2a is incident on point 5 on mirror 23 and the reflected beam from point 5 on mirror 23 is returned to mirror 22 as reflected beam 3a incident on point 6 on mirror 22.

A third confocal resonator cell is then set up as the beam reflected from point 6 on mirror 22, beam 1b reflected to point 7 on mirror 20 and from there is reflected as beam 2b incident on point 8 on mirror 21 and then returned to mirror 20 at point 9 on mirror 20 as beam 3b. The reflected beam from point 9 on mirror 20, beam, 1c is incident on point 10 on mirror 22 and reflected from there as beam 2c to point 11 on mirror 23 and from there, reflected beam 3c is incident on point 12 on mirror 22 which is aligned to return reflected beam 1' to the beam splitter (not shown in FIGS. 1 and 2).

Turning now to FIGS. 3-6 it can be seen that no matter what the angle orientation of the mirrors 20, 21, 22, 23 in a respective confocal resonance cell, the beam will always come back to the same point 12 on mirror 22. FIGS. 3-6 illustrate the effect within a single confocal resonance cell of misalignment from perfect alignment, e.g., as illustrated in FIGS. 1-2. Because of, e.g., this property, the 12 pass design 18 will always be aligned as long as the mirrors, e.g., mirrors 20, 21, 22, 23 are positioned well enough to redirect the beam from a first mirror in a respective confocal resonator cell to the correct opposing mirror. Therefore, the angular allowance of the system is driven be the size of the mirrors and the size of the beam. This also means, e.g., that the design is almost completely immune to, e.g., initial misalignment or, e.g., vibration problems that cause relative movements between the mirrors, e.g., mirrors 20, 21, 22 and 23, provided that the variations are small enough as to not to redirect the beam off the respective opposing mirror.

Figure 3:
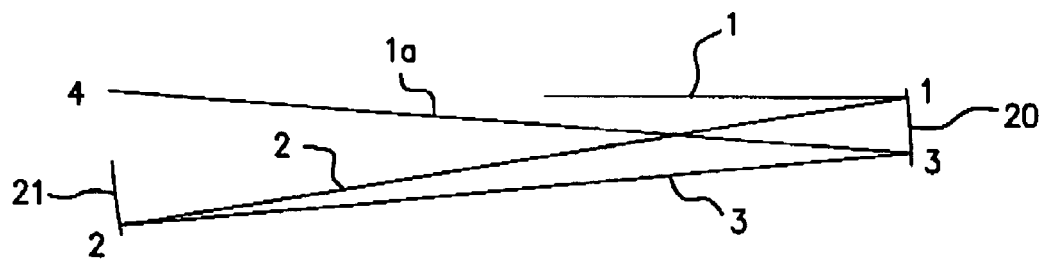
FIGS. 3-5 show aspects of the operation according to an embodiment of the present invention showing, e.g., the tilt tolerance aspect of an embodiment of the present invention.
Figure 4:
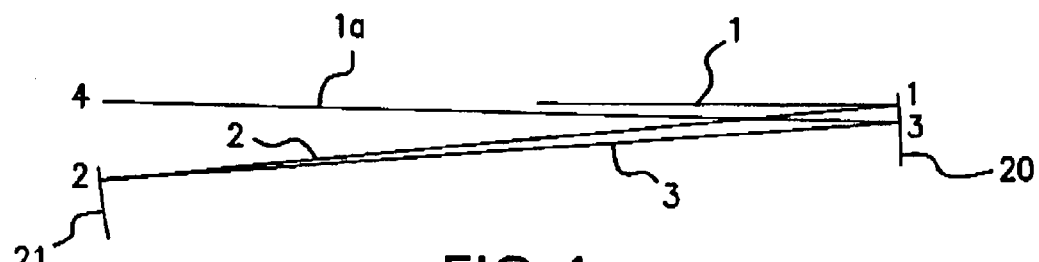
Figure 5:
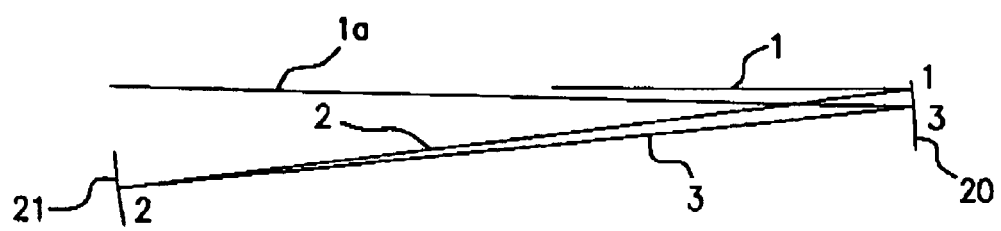

Turning now to FIG. 3 there is shown, e.g., a first of the confocal resonance cells according to FIGS. 1 and 2, showing, e.g., beams 1, 2 and 3 in a first confocal resonance cell as shown, e.g., in FIGS. 1 and 2, e.g., with the mirrors 20 and 21 aligned so that, e.g., the full extent of mirror 20 is used to separate points 1 and 3 and showing the reflection from point 2 on mirror 21 returning to point 3 on mirror 20, from which it is reflected to point 4 on mirror 22 (not shown in FIGS. 3-5).

Turning to FIG. 4 three is shown according to an aspect of an embodiment of the present invention the effect of, e.g., a small misalignment of mirror 20, e.g., a 1.5° tilt, such that, e.g., the point 2 on mirror 21 to which beam 2 travels from point 1 on mirror 20, due to the misalignment is displaces almost completely across the face of the mirror 21, but remaining on the face of the mirror 21. As can be seen, the respective beam 3, incident an point 3 of mirror 20 is also reflected to a point 3 that is displaced across the face of the mirror 20 from that shown e.g., in FIGS. 1-3, but as can also be seen, the beam 1a reflecting from point 3 on mirror 20 to point 4 on mirror 22 remains incident on a point 4 on mirror 22 that is essentially the same as illustrated in FIGS. 1-3, despite the misalignment of mirror 20.

Turning to FIG. 5, three is illustrated schematically, e.g., the effect of a misalignment of mirror 21 according to aspects of an embodiment of the present invention wherein the beam 2 is incident on mirror 21 at a point 2 displaces across the face of mirror 21, also displacing the point 3 on mirror, similarly to FIG. 4, but with the beam 1a reflected from point 3 on mirror 20 in FIG. 5 again returning to the proper point 4 on mirror 22 (not shown in FIG. 5.)

FIGS. 4 and 5 illustrate, e.g., that despite misalignment of mirror 20 with respect to mirror 21, which can include misalignment of both from the perfect alignment, illustrated schematically in FIGS. 1-3, the beam reflects back upon itself and so long as it remains within the confines of the surface of the mirror 20 (the first mirror of the respective confocal resonator) the exit beam from the respective confocal resonator will arrive at the proper place on the next mirror in sequence, e.g., mirror 22 (not shown in FIGS. 4 and 5).

Figure 6:
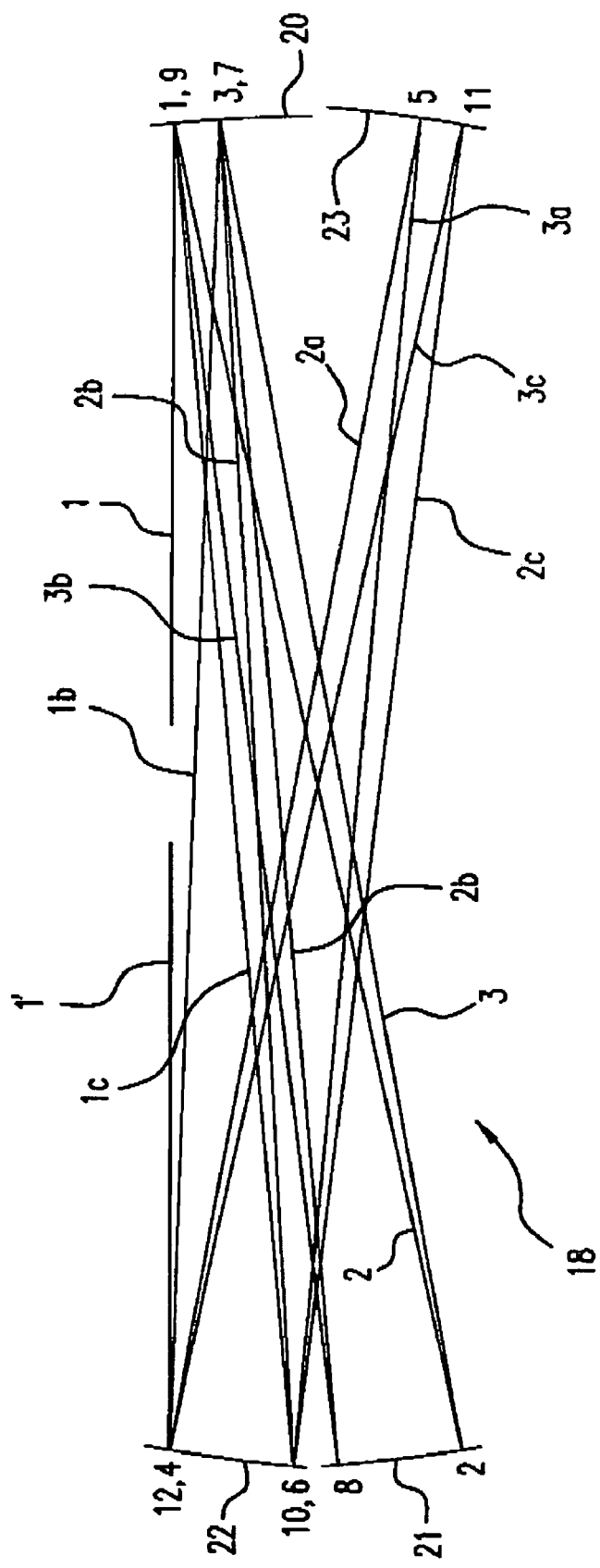
FIG. 6 illustrates partially schematically in cross section, e.g., the tilt tolerance of the pulse stretcher according to FIGS. 1-2.

Turning now to FIG. 6 there is shown schematically the operation of the entire pulse stretcher according to an aspect of an embodiment of the present invention with, e.g., a slight tilt in a mirror 20, 21, 22 or 23, e.g., mirror 21. FIG. 6 shows that despite the misalignment the last beam 1' remains perfectly aligned with the beam splitter (not shown) output of the delay path for the pulse stretcher 18 according to aspects of an embodiment of the present invention.

In operation a single pulse stretcher of the type described according to aspects of an embodiment of the present invention may stretch a typical excimer or other fluorine gas discharge laser, e.g., a molecular fluorine gas discharge laser, having a pulse duration of the output laser pulse of on the order of about 40 ns having, e.g., a $T_{IS}$ of on the order of about, e.g., 8 ns, to a pulse having several peaks not greater than, e.g., about 40% of the input peak power to the pulse stretcher 18 according to aspects of an embodiment of the present invention, and having, e .g., a $T_{IS}$ of on the order of about 45 ns.

It will also be understood, that increasing the radius of curvature of the mirrors 20, 21, 22 and 23 can increase by the achievable pulse stretching and $T_{IS}$, at the expense of some increase in overall length of the pulse stretcher 18 according to aspects of an embodiment of the present invention and also larger mirror size and, therefore, a larger housing footprint transversely of the overall pulse stretcher length. According to another aspect of an embodiment of the present invention, a method of scanning the laser beam and calculating weighted average of the spatial coherence is proposed, e.g., for measuring more accurately the spatial coherence of an output laser beam pulse as is pertinent to proper performance of the output laser beam pulse in properly serving the function of, e.g., an integrated circuit lithography tool light source, e.g., a DUV light source. Implementation of this method revealed interesting aspects of laser output light pulse beam profiles, e.g., in regard to spatial coherence, e.g., for XLA beam spatial coherence profiles. Applicants have discovered that an aspect of using, e.g., a beam stretcher according to aspects of an embodiment of the present invention can provide very beneficial output laser pulse beam spatial coherency properties. It is most desirable to limit spatial coherency.

Figure 7:
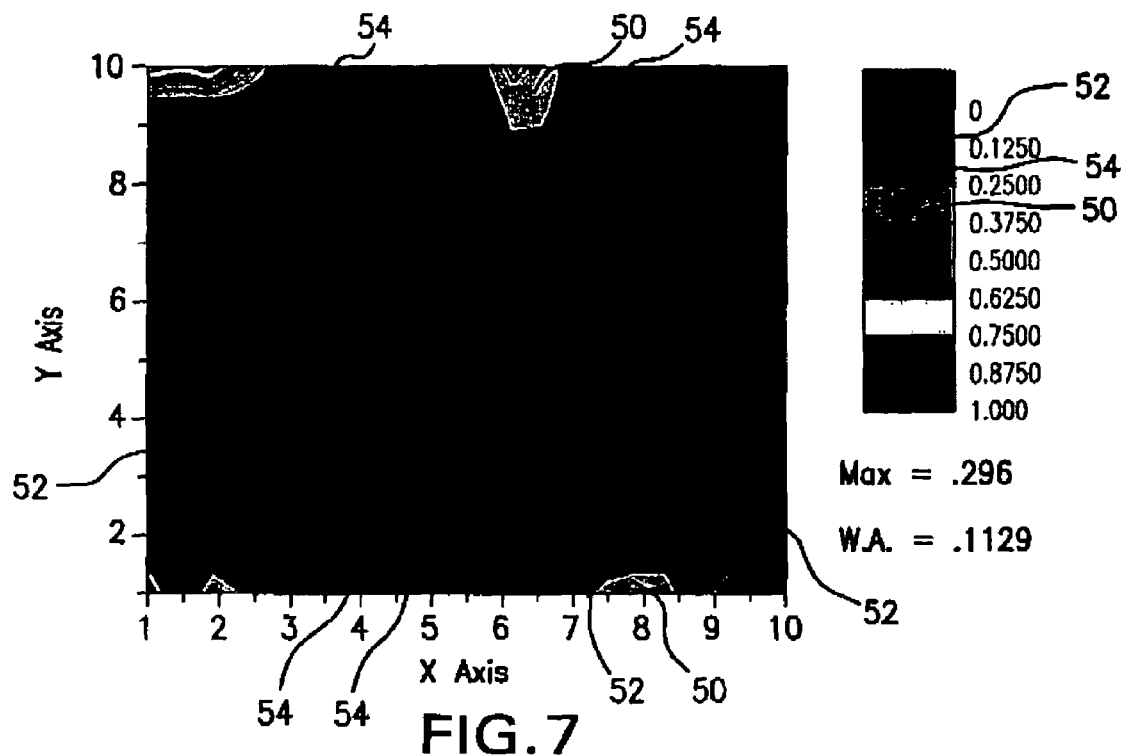
FIG. 7 shows a measurement of the two dimensional spatial coherence of an output laser pulse passed through two pulse stretchers in series according to aspects of an embodiment of the present invention.
Figure 8:
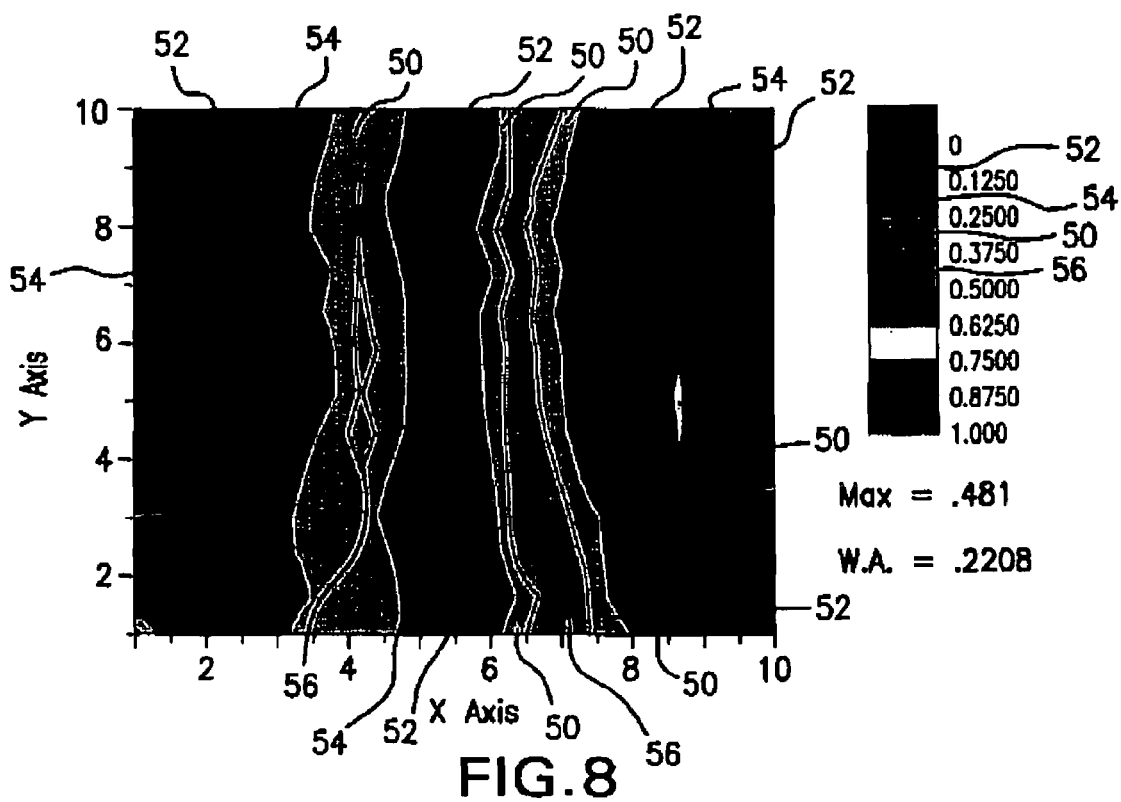
FIG. 8 shows a measurement of the two dimensional spatial coherence of an output laser pulse passed through a single pulse stretcher according to aspects of an embodiment of the present invention.
Figure 9:
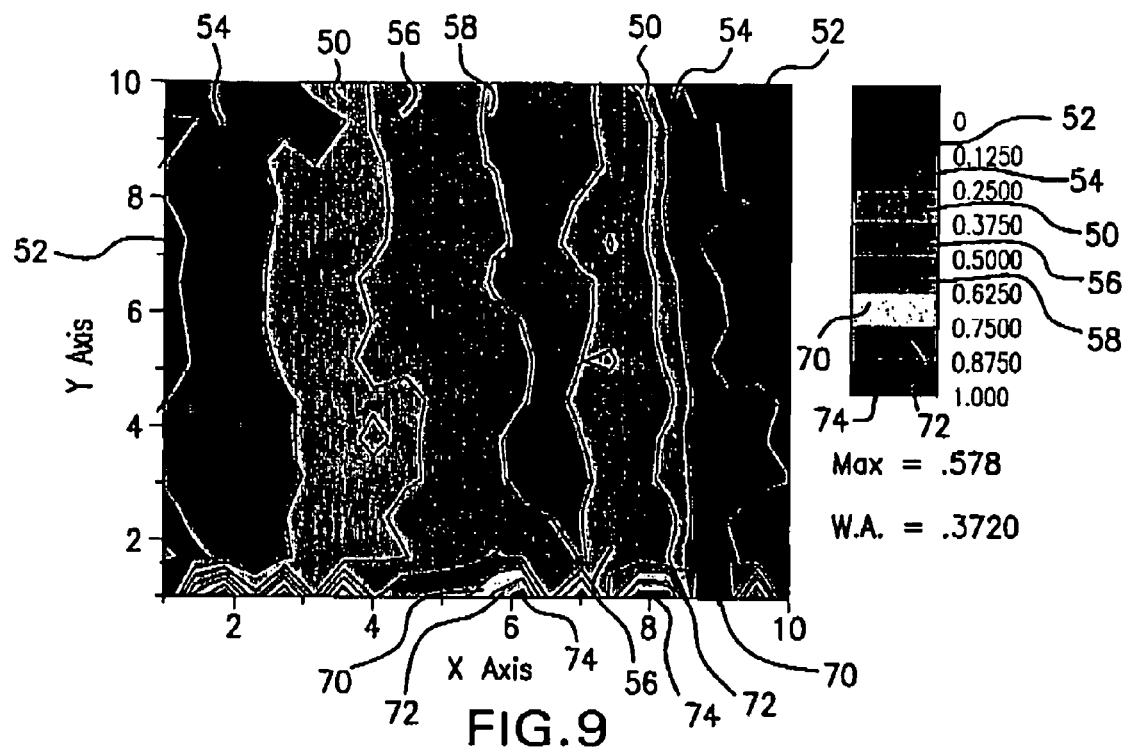
FIG. 9 shows a measurement of the two dimensional spatial coherence of an output laser pulse without any pulse stretching according to an aspect of an embodiment of the present invention.

Utilizing, e.g., two pairs of pin holes, and an X-Y automated scanning setup (not shown) along with imaging optics (not shown) and a photo-diode array ("PDA"), and along with computer control to, e.g., acquire and analyze the data, applicants have reviewed the spatial coherency in two dimensions of a beam that has not been passed through a pulse stretcher, a so-called Optical Pulse Stretcher ("OpuS") provided along with certain of applicants' assignee's products, e.g., XLA series products. This scanning means of estimation of output laser pulse coherence produced data illustrated, e.g., in FIGS. 7-9, showing respectively the information regarding two dimensional beam coherency for, respectively an unstretched pulse, i.e., a pulse not passed through applicants' assignee's OpuS (FIG. 7), a pulse passed through a single stage pulse stretcher, e.g., applicants' assignee's OpuS, and an output laser pulse beam passed through a two stage Opus. Applicants' assignee's OpuS in addition to stretching the pulses to improve, e.g., $T_{IS}$, performs certain, e.g., optical flipping and rotating and the like, of the output laser pulse beam, with results indicated illustratively in FIGS. 7-9.

TABLE I

|  | XLA no OPuS | XLA one 2 × OpuS (XLA100) | XLA two OpuS 4 × OPuS (XLA105 |
|---|---|---|---|
| Peak contrast | 0.58 | 0.48 | 0.30 |
| Weighted Average | 0.37 | 0.22 | 0.11 |

As shown in FIG. 7, and listed in Table I, the output laser pulse has a peak contrast of about, e.g., 0.3, and a weighted average overall of about, e.g., 0.11. FIG. 7 shows that the horizontal and vertical coherency is low, with, e.g., most of the beam being in regions 52 (0-0.125) as indicated in the bar graph to the right of the illustration or region 54 ((0.125-0.250), with some small portions of the beam in region 50 (0.250-0.375), and some further still smaller portions in other ranges, which are due to boundary effects of the measurement setup. These measurements were taken with a 2×OpuS pulse stretcher and a 4× Opus pulse stretcher in place in the beam path.

Turning to FIG. 8 there is shown an illustration of the beam becoming more coherent, particularly as measured in the x-axis, including much more of the beam in range 50 (0.250-0.375) and also including still further areas in range 56 (0.375-0.500). These measurements were taken with only a 2× OpuS in place in the beam path.

As shown in FIG. 9, the beam is even more coherent when both pulse stretchers are out of the beam path, now including a more definite distribution of more or less equal areas in the ranges 50-54 and distributed more or less symmetrically about the vertical centerline axis of the beam along the x-axis and further now including a significant portion in range 58 (0.500-0.625) with some small portions of the beam in the ranges 70 (0.625-0.750), 72 (0.750-0.875) and 74 (0.875-1.000). Coherency is being measured through the diffraction fringes set up by the beam passing through the pin holes across the beam profile, with the more coherent light in the laser beam resulting in more fringes and more contrast.

For the beam of FIG. 8, as indicated in Table I, the maximum contract increased to 0.48 and the overall weighted average increased to 0.22 and for FIG. 9, the maximum contract increased to 0.58 and the overall weighted average to 0.37. This amounts to, e.g., an almost one half increase in the maximum contrast and an almost two thirds decrease in overall weighted average.

As can be seen from the above, the pulse stretcher has not only the beneficial results of increasing pulse length and decreasing peak pulse intensity, resulting in higher $T_{IS}$ but also is a very efficient reducer of spatial coherence in the output laser light beam.

Figure 10:
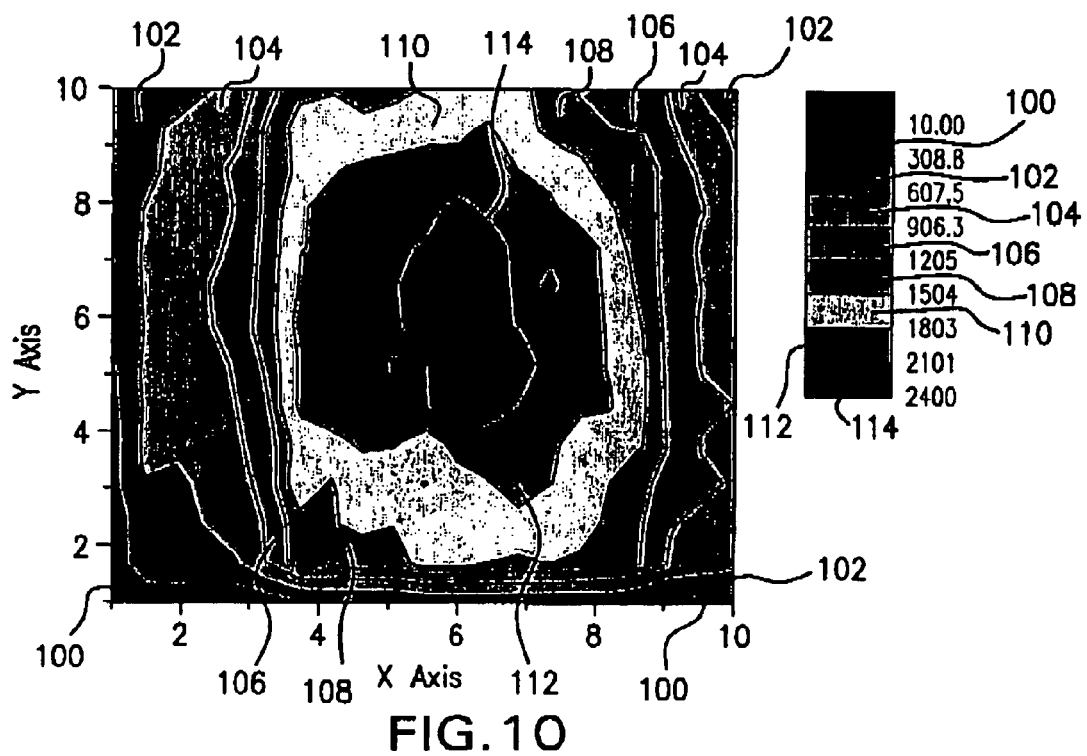
FIG. 10 shows a two dimensional measurement of the intensity distribution of an output laser pulse according to an aspect of an embodiment of the present invention.

Turning now to FIG. 10, there is shown a beam intensity profile in two dimensions, including, e.g., intensities ranging from 10-308.8 arbitrary units of scale, in region 100, generally around the periphery of the beam profile to 2101-2400 arbitrary units of scale (region 114) generally at the center of the beam profile, with regions 102 (308.8-607.5), 104 (607.5-906.3), 106 (906.3-1205), 108 (1205-1504), 108 (1504-1803), 112 (1803-2101) and 114 (2101-2400) generally from the periphery to the center of the beam profile.

It will be understood by those skilled in the art that many changes and modifications may be made to the present invention and aspects of the present invention without departing from the scope and content of the appended claims and that the appended claims should not be limited in scope or content to the particular aspects of preferred embodiments disclosed in the present application.

We claim:

1. A high peak power short pulse duration gas discharge laser system producing a laser output pulse comprising:
    a pulse stretcher comprising:
        a laser output pulse optical delay initiating optic diverting a portion of the output laser pulse into an optical delay having an optical delay path and comprising:
            a plurality of confocal resonators in series aligned to deliver the output of the optical delay to the laser output pulse optical delay initiating optic; and
            a first confocal resonator cell of the plurality of confocal resonators comprising: a first concave spherical mirror having a radius of curvature receiving an input beam from the laser output pulse optical delay initiating optic comprising the portion of the output laser pulse at a first point on a face of the first concave spherical mirror and generating a first reflected beam; a second concave spherical mirror having the same radius of curvature and separated from the first concave spherical mirror by the radius of curvature and receiving the first reflected beam at a first point on a face of the second concave spherical mirror and generating a second reflected beam incident on a second point on the face of the first concave spherical mirror, the second reflected beam being reflected by the first concave spherical mirror from the second point on the first mirror to form an output beam from the first confocal resonator cell; and, a second confocal resonator cell receiving the output beam of the first confocal resonator cell as an input beam of the second confocal resonator cell.

2. The apparatus of claim 1 further comprising: the plurality of confocal resonators comprises four confocal resonators comprising a twelve pass four mirror arrangement.

3. The apparatus of claim 2 further comprising: each of the plurality of confocal resonators comprises a first concave spherical mirror having a radius of curvature and a second concave spherical mirror having the same radius of curvature and separated by the radius of curvature.

4. The apparatus of claim 3 further comprising: the pulse stretcher comprising a first confocal resonator cell comprising: a first concave spherical mirror having a radius of curvature receiving an input beam from the laser output pulse optical delay initiating optic comprising the portion of the output laser pulse at a first point on a face of the first concave spherical mirror and generating a first reflected beam; a second concave spherical mirror having the same radius of curvature and separated from the first concave spherical mirror by the radius of curvature and receiving the first reflected beam at a first point on a face of the second concave spherical mirror and generating a second reflected beam incident on a second point on the face of the first concave spherical mirror, the second reflected beam being reflected by the first concave spherical mirror from the second point on the first mirror to form an output beam from the first confocal resonator cell; and, a second confocal resonator cell receiving the output beam of the first confocal resonator cell as an input beam of the second confocal resonator cell.

5. The apparatus of claim 2 further comprising: the pulse stretcher comprising a first confocal resonator cell comprising: a first concave spherical mirror having a radius of curvature receiving an input beam from the laser output pulse optical delay initiating optic comprising the portion of the output laser pulse at a first point on a face of the first concave spherical mirror and generating a first reflected beam; a second concave spherical mirror having the same radius of curvature and separated from the first concave spherical mirror by the radius of curvature and receiving the first reflected beam at a first point on a face of the second concave spherical mirror and generating a second reflected beam incident on a second point on the face of the first concave spherical mirror, the second reflected beam being reflected by the first concave spherical mirror from the second point on the first mirror to form an output beam from the first confocal resonator cell; and, a second confocal resonator cell receiving the output beam of the first confocal resonator cell as an input beam of the second confocal resonator cell.

6. The apparatus of claim 1 further comprising: each of the plurality of confocal resonators comprises a first concave spherical mirror having a radius of curvature and a second concave spherical mirror having the same radius of curvature and separated by the radius of curvature.

7. The apparatus of claim 6 further comprising: the pulse stretcher comprising a first confocal resonator cell comprising: a first concave spherical mirror having a radius of curvature receiving an input beam from the laser output pulse optical delay initiating optic comprising the portion of the output laser pulse at a first point on a face of the first concave spherical mirror and generating a first reflected beam; a second concave spherical mirror having the same radius of curvature and separated from the first concave spherical mirror by the radius of curvature and receiving the first reflected beam at a first point on a face of the second concave spherical mirror and generating a second reflected beam incident on a second point on the face of the first concave spherical mirror, the second reflected beam being reflected by the first concave spherical mirror from the second point on the first mirror to form an output beam from the first confocal resonator cell; and, a second confocal resonator cell receiving the output beam of the first confocal resonator cell as an input beam of the second confocal resonator cell.

8. A high peak power short pulse duration gas discharge laser system producing a laser output pulse comprising:

an output laser pulse beam delivery unit comprising:
a laser output pulse optical delay initiating optic diverting a portion of the output laser pulse into an optical delay having an optical delay path and comprising:
a plurality of confocal resonators in series aligned to deliver the output of the optical delay to the laser output pulse optical delay initiating optic; and
a first confocal resonator cell of the plurality of confocal resonators comprising: a first concave spherical mirror having a radius of curvature receiving an input beam from the laser output pulse optical delay initiating optic comprising the portion of the output laser pulse at a first point on a face of the first concave spherical mirror and generating a first reflected beam; a second concave spherical mirror having the same radius of curvature and separated from the first concave spherical mirror by the radius of curvature and receiving the first reflected beam at a first point on a face of the second concave spherical mirror and generating a second reflected beam incident on a second point on the face of the first concave spherical mirror, the second reflected beam being reflected by the first concave spherical mirror from the second point on the first mirror to form an output beam from the first confocal resonator cell; and, a second confocal resonator cell receiving the output beam of the first confocal resonator cell as an input beam of the second confocal resonator cell.

9. The apparatus of claim 8 further comprising: the plurality of confocal resonators comprises four confocal resonators comprising a twelve pass four mirror arrangement.

10. The apparatus of claim 9 further comprising: each of the plurality of confocal resonators comprises a first concave spherical mirror having a radius of curvature and a second concave spherical mirror having the same radius of curvature and separated by the radius of curvature.

11. The apparatus of claim 10 further comprising: the pulse stretcher comprising a first confocal resonator cell comprising: a first concave spherical mirror having a radius of curvature receiving an input beam from the laser output pulse optical delay initiating optic comprising the portion of the output laser pulse at a first point on a face of the first concave spherical mirror and generating a first reflected beam; a second concave spherical mirror having the same radius of curvature and separated from the first concave spherical mirror by the radius of curvature and receiving the first reflected beam at a first point on a face of the second concave spherical mirror and generating a second reflected beam incident on a second point on the face of the first concave spherical mirror, the second reflected beam being reflected by the first concave spherical mirror from the second point on the first mirror to form an output beam from the first confocal resonator cell; and, a second confocal resonator cell receiving the output beam of the first confocal resonator cell as an input beam of the second confocal resonator cell.

12. The apparatus of claim 9 further comprising: the pulse stretcher comprising a first confocal resonator cell comprising: a first concave spherical mirror having a radius of curvature receiving an input beam from the laser output pulse optical delay initiating optic comprising the portion of the output laser pulse at a first point on a face of the first concave spherical mirror and generating a first reflected beam; a second concave spherical mirror having the same radius of curvature and separated from the first concave spherical mirror by the radius of curvature and receiving the first reflected beam at a first point on a face of the second concave spherical mirror and generating a second reflected beam incident on a second point on the face of the first concave spherical mirror, the second reflected beam being reflected by the first concave spherical mirror from the second point on the first mirror to form an output beam from the first confocal resonator cell; and, a second confocal resonator cell receiving the output beam of the first confocal resonator cell as an input beam of the second confocal resonator cell.

13. The apparatus of claim 8 further comprising: each of the plurality of confocal resonators comprises a first concave spherical mirror having a radius of curvature and a second concave spherical mirror having the same radius of curvature and separated by the radius of curvature.

14. The apparatus of claim 13 further comprising: the pulse stretcher comprising a first confocal resonator cell comprising: a first concave spherical mirror having a radius of curvature receiving an input beam from the laser output pulse optical delay initiating optic comprising the portion of the output laser pulse at a first point on a face of the first concave spherical mirror and generating a first reflected beam; a second concave spherical mirror having the same radius of curvature and separated from the first concave spherical mirror by the radius of curvature and receiving the first reflected beam at a first point on a face of the second concave spherical mirror and generating a second reflected beam incident on a second point on the face of the first concave spherical mirror, the second reflected beam being reflected by the first concave spherical mirror from the second point on the first mirror to form an output beam from the first confocal resonator cell; and, a second confocal resonator cell receiving the output beam of the first confocal resonator cell as an input beam of the second confocal resonator cell.

15. An integrated circuit lithography tool light source comprising:
a high peak power short pulse duration gas discharge laser system producing a laser output pulse comprising:
a laser output pulse optical delay initiating optic diverting a portion of the output laser pulse into an optical delay having an optical delay path and comprising:
a plurality of confocal resonators in series aligned to deliver the output of the optical delay to the laser output pulse optical delay initiating optic and
a first confocal resonator cell of the plurality of confocal resonators comprising: a first concave spherical mirror having a radius of curvature receiving an input beam from the laser output pulse optical delay initiating optic comprising the portion of the output laser pulse at a first point on a face of the first concave spherical mirror and generating a first reflected beam; a second concave spherical mirror having the same radius of curvature and separated from the first concave spherical mirror by the radius of curvature and receiving the first reflected beam at a first point on a face of the second concave spherical mirror and generating a second reflected beam incident on a second point on the face of the first concave spherical mirror, the second reflected beam being reflected by the first concave spherical mirror from the second point on the first mirror to form an output beam from the first confocal resonator cell; and, a second confocal resonator cell receiving the output beam of the first confocal resonator cell as an input beam of the second confocal resonator cell.

16. The apparatus of claim 15 further comprising: the plurality of confocal resonators comprises four confocal resonators comprising a twelve pass four mirror arrangement.

17. The apparatus of claim 16 further comprising: each of the plurality of confocal resonators comprises a first concave spherical mirror having a radius of curvature and a second concave spherical mirror having the same radius of curvature and separated by the radius of curvature.

18. The apparatus of claim 17 further comprising: the pulse stretcher comprising a first confocal resonator cell comprising: a first concave spherical mirror having a radius of curvature receiving an input beam from the laser output pulse optical delay initiating optic comprising the portion of the output laser pulse at a first point on a face of the first concave spherical mirror and generating a first reflected beam; a second concave spherical mirror having the same radius of curvature and separated from the first concave spherical mirror by the radius of curvature and receiving the first reflected beam at a first point on a face of the second concave spherical mirror and generating a second reflected beam incident on a second point on the face of the first concave spherical mirror, the second reflected beam being reflected by the first concave spherical mirror from the second point on the first mirror to form an output beam from the first confocal resonator cell; and, a second confocal resonator cell receiving the output beam of the first confocal resonator cell as an input beam of the second confocal resonator cell.

19. The apparatus of claim 16 further comprising: the pulse stretcher comprising a first confocal resonator cell comprising: a first concave spherical mirror having a radius of curvature receiving an input beam from the laser output pulse optical delay initiating optic comprising the portion of the output laser pulse at a first point on a face of the first concave spherical mirror and generating a first reflected beam; a second concave spherical mirror having the same radius of curvature and separated from the first concave spherical mirror by the radius of curvature and receiving the first reflected beam at a first point on a face of the second concave spherical mirror and generating a second reflected beam incident on a second point on the face of the first concave spherical mirror, the second reflected beam being reflected by the first concave spherical mirror from the second point on the first mirror to form an output beam from the first confocal resonator cell; and, a second confocal resonator cell receiving the output beam of the first confocal resonator cell as an input beam of the second confocal resonator cell.

20. The apparatus of claim 15 further comprising: each of the plurality of confocal resonators comprises a first concave spherical mirror having a radius of curvature and a second concave spherical mirror having the same radius of curvature and separated by the radius of curvature.

21. The apparatus of claim 20 further comprising: the pulse stretcher comprising a first confocal resonator cell comprising: a first concave spherical mirror having a radius of curvature receiving an input beam from the laser output pulse optical delay initiating optic comprising the portion of the output laser pulse at a first point on a face of the first concave spherical mirror and generating a first reflected beam; a second concave spherical mirror having the same radius of curvature and separated from the first concave spherical mirror by the radius of curvature and receiving the first reflected beam at a first point on a face of the second concave spherical mirror and generating a second reflected beam incident on a second point on the face of the first concave spherical mirror, the second reflected beam being reflected by the first concave spherical mirror from the second point on the first mirror to form an output beam from the first confocal resonator cell; and, a second confocal resonator cell receiving the output beam of the first confocal resonator cell as an input beam of the second confocal resonator cell.

22. A high peak power short pulse duration gas discharge laser system producing a laser output pulse comprising; an output laser pulse beam delivery unit comprising:
- a laser output pulse optical delay initiating optic diverting a portion of the output laser pulse into an optical delay having an optical delay path and comprising:
- a plurality of confocal resonators in series aligned to deliver the output of the optical delay to the laser output pulse optical delay initiating optic; and
- a first confocal resonator cell of the plurality of confocal resonators comprising: a first concave spherical mirror having a radius of curvature receiving input beam from the laser output pulse optical delay initiating optic comprising the portion of the output laser pulse at a first point on a face of the first concave spherical mirror and generating a first reflected beam; a second concave spherical mirror having the same radius of curvature and separated from the first concave spherical mirror by the radius of curvature and receiving the first reflected beam at a first point on a face of the second concave spherical mirror and generating a second reflected beam incident on a second point on the face of the first concave spherical mirror, the second reflected beam being reflected by the first concave spherical mirror from the second point on the first mirror to form an output beam from the first confocal resonator cell; and, a second confocal resonator cell receiving the output beam of the first confocal resonator cell as an input beam of the second confocal resonator cell.

23. The apparatus of claim 22 further comprising: the plurality of confocal resonators comprises four confocal resonators comprising a twelve pass four mirror arrangement.

24. The apparatus of claim 23 further comprising: each of the plurality of confocal resonators comprises a first concave spherical mirror having a radius of curvature and a second concave spherical mirror having the same radius of curvature and separated by the radius of curvature.

25. The apparatus of claim 24 further comprising: the pulse stretcher comprising a first confocal resonator cell comprising: a first concave spherical mirror having a radius of curvature receiving an input beam from the laser output pulse optical delay initiating optic comprising the portion of the output laser pulse at a first point on a face of the first concave spherical mirror and generating a first reflected beam; a second concave spherical mirror having the same radius of curvature and separated from the first concave spherical mirror by the radius of curvature and receiving the first reflected beam at a first point on a face of the second concave spherical mirror and generating a second reflected beam incident on a second point on the face of the first concave spherical mirror, the second reflected beam being reflected by the first concave spherical mirror from the second point on the first mirror to form an output beam from the first confocal resonator cell; and, a second confocal resonator cell receiving the output beam of the first confocal resonator cell as an input beam of the second confocal resonator cell.

26. The apparatus of claim 23 further comprising: the pulse stretcher comprising a first confocal resonator cell comprising: a first concave spherical mirror having a radius of curvature receiving an input beam from the laser output pulse optical delay initiating optic comprising the portion of the output laser pulse at a first point on a face of the first concave spherical mirror and generating a first reflected beam; a second concave spherical mirror having the same radius of curvature and separated from the first concave spherical mirror by the radius of curvature and receiving the first reflected beam at a first point on a face of the second concave spherical mirror and generating a second reflected beam incident on a second point on the face of the first concave spherical mirror, the second reflected beam being reflected by the first concave spherical mirror from the second point on the first mirror to form an output beam from the first confocal resonator cell; and, a second confocal resonator cell receiving the output beam of the first confocal resonator cell as an input beam of the second confocal resonator cell.

27. The apparatus of claim 22 further comprising: each of the plurality of confocal resonators comprises a first concave spherical mirror having a radius of curvature and a second concave spherical mirror having the same radius of curvature and separated by the radius of curvature.

28. The apparatus of claim 27 further comprising: the pulse stretcher comprising a first confocal resonator cell comprising: a first concave spherical mirror having a radius of curvature receiving an input beam from the laser output pulse optical delay initiating optic comprising the portion of the output laser pulse at it first point on a face of the first concave spherical mirror and generating a first reflected beam; a second concave spherical mirror having the same radius of curvature and separated from the first concave spherical mirror by the radius of curvature and receiving the first reflected beam at a first point on a face of the second concave spherical mirror and generating a second reflected beam incident on a second point on the face of the first concave spherical mirror, the second reflected beam being reflected by the first concave spherical mirror from the second point on the first mirror to form an output beam from the first confocal resonator cell; and, a second confocal resonator cell receiving the output beam of the first confocal resonator cell as an input beam of the second confocal resonator cell.

29. An integrated circuit lithography tool comprising: a high peak power short pulse duration gas discharge laser system producing a laser output pulse comprising:
a laser output pulse optical delay initiating optic diverting a portion of the output laser pulse into an optical delay having an optical delay path and comprising:
a plurality of confocal resonators in series aligned to deliver the output of the optical delay to the laser output pulse optical delay initiating optic; and
a first confocal resonator cell of the plurality of confocal resonators comprising: a first concave spherical mirror having a radius of curvature receiving an input beam from the laser output pulse optical delay initiating optic comprising the portion of the output laser pulse at a first point on a face of the first concave spherical mirror and generating a first reflected beam; a second concave spherical mirror having the same radius of curvature and separated from the first concave spherical mirror by the radius of curvature and receiving the first reflected beam at a first point on a face of second concave spherical mirror and generating a second reflected beam incident on a second point on the face of the first concave spherical mirror, the second reflected beam being reflected by the first concave spherical mirror from the second point on the first mirror to form an output beam from the first confocal resonator cell; and, a second confocal resonator cell receiving the output beam of the first confocal resonator cell as an input beam of the second confocal resonator cell.

30. The apparatus of claim 29 further comprising: the plurality of confocal resonators comprises four confocal resonators comprising a twelve pass four mirror arrangement.

31. The apparatus of claim 30 further comprising: each of the plurality of confocal resonators comprises a first concave spherical mirror having a radius of curvature and a second concave spherical mirror having the same radius of curvature and separated by the radius of curvature.

32. The apparatus of claim 31 further comprising: the pulse stretcher comprising a first confocal resonator cell comprising: a first concave spherical mirror having a radius of curvature receiving an input beam from the laser output pulse optical delay initiating optic comprising the portion of the output laser pulse at a first point on a face of the first concave spherical mirror and generating a first reflected beam; a second concave spherical mirror having the same radius of curvature and separated from the first concave spherical mirror by the radius of curvature and receiving the first reflected beam at a first point on a face of the second concave spherical mirror and generating a second reflected beam incident on a second point on the face of the first concave spherical mirror, the second reflected beam being reflected by the first concave spherical mirror from the second point on the first mirror to form an output beam from the first confocal resonator cell; and, a second confocal resonator cell receiving the output beam of the first confocal resonator cell as an input beam of the second confocal resonator cell.

33. The apparatus of claim 30 further comprising: the pulse stretcher comprising a first confocal resonator cell comprising: a first concave spherical mirror having a radius of curvature receiving an input beam from the laser output pulse optical delay initiating optic comprising the portion of the output laser pulse at a first point on a face of the first concave spherical mirror and generating a first reflected beam; a second concave spherical mirror having the same radius of curvature and separated from the first concave spherical mirror by the radius of curvature and receiving the first reflected beam at a first point on a face of the second concave spherical mirror and generating a second reflected beam incident on a second point on the face of the first concave spherical mirror, the second reflected beam being reflected by the first concave spherical mirror from the second point on the first mirror to form an output beam from the first confocal resonator cell; and, a second confocal resonator cell receiving the output beam of the first confocal resonator cell as an input beam of the second confocal resonator cell.

34. The apparatus of claim 29 further comprising: each of the plurality of confocal resonators comprises a first concave spherical mirror having a radius of curvature and a second concave spherical mirror having the same radius of curvature and separated by the radius of curvature.

35. The apparatus of claim 34 further comprising: the pulse stretcher comprising a first confocal resonator cell comprising: a first concave spherical mirror having a radius of curvature receiving an input beam from the laser output pulse optical delay initiating optic comprising the portion of the output laser pulse at a first point on a face of the first concave spherical mirror and generating a first reflected beam; a second concave spherical mirror having the same radius of curvature and separated from the first concave spherical mirror by the radius of curvature and receiving the first reflected beam at a first point on a face of the second concave spherical mirror and generating a second reflected beam incident on a second point on the face of the first concave spherical mirror, the second reflected beam being reflected by the first concave spherical mirror from the second point on the first mirror to form an output beam from the first confocal resonator cell; and, a second confocal resonator cell receiving the output beam of the first confocal resonator cell as an input beam of the second confocal resonator cell.

36. An integrated circuit lithography tool comprising: a high peak power short pulse duration gas discharge laser system producing a laser output pulse comprising:
a laser output pulse optical delay initiating optic diverting a portion of the output laser pulse into an optical delay having an optical delay path and comprising:
a plurality of confocal resonators in series aligned to deliver the output of the optical delay to the laser output pulse optical delay initiating optic; and
a first confocal resonator cell of the plurality of confocal resonators comprising: a first concave spherical mirror having a radius of curvature receiving an input beam from the laser output pulse optical delay initiating optic comprising the portion of the output laser pulse at a first point on a face of the first concave spherical mirror and generating a first reflected beam; a second concave spherical mirror having the same radius of curvature and separated from the first concave spherical mirror by the radius of curvature and receiving the first reflected beam at a first point on a face of the second concave spherical mirror and generating a second reflected beam incident on a second point on the face of the first concave spherical mirror, the second reflected beam being reflected by the first concave spherical mirror from the second point on the first mirror to form an output beam from the first confocal resonator cell; and, a second confocal resonator cell receiving the output beam of the first confocal resonator cell as an input beam of the second confocal resonator cell.

37. The apparatus of claim 36 further comprising: the plurality of confocal resonators comprises four confocal resonators comprising a twelve pass four mirror arrangement.

38. The apparatus of claim 37 further comprising: each of the plurality of confocal resonators comprises a first concave spherical mirror having a radius of curvature and a second concave spherical mirror having the same radius of curvature and separated by the radius of curvature.

39. The apparatus of claim 38 further comprising: the pulse stretcher comprising a first confocal resonator cell comprising: a first concave spherical mirror having a radius of curvature receiving an input beam from the laser output pulse optical delay initiating optic comprising the portion of the output laser pulse at a first point on a face of the first concave spherical mirror and generating a first reflected beam; a second concave spherical mirror having the same radius of curvature and separated from the first concave spherical mirror by the radius of curvature and receiving the first reflected beam at a first point on a face of the second concave spherical mirror and generating a second reflected beam incident on a second point on the face of the first concave spherical mirror, the second reflected beam being reflected by the first concave spherical mirror from the second point on the first mirror to form an output beam from the first confocal resonator cell; and, a second confocal resonator cell receiving the output beam of the first confocal resonator cell as an input beam of the second confocal resonator cell.

40. The apparatus of claim 37 further comprising: the pulse stretcher comprising a first confocal resonator cell comprising: a first concave spherical mirror having a radius of curvature receiving an input beam from the laser output pulse optical delay initiating optic comprising the portion of the output laser pulse at a first point on a face of the first concave spherical mirror and generating a first reflected beam; a second concave spherical mirror having the same radius of curvature and separated from the first concave spherical mirror by the radius of curvature and receiving the first reflected beam at a first point on a face of the second concave spherical mirror and generating a second reflected beam incident on a second point on the face of the first concave spherical mirror, the second reflected beam being reflected by the first concave spherical mirror from the second point on the first mirror to form an output beam from the first confocal resonator cell; and, a second confocal resonator cell receiving the output beam of the first confocal resonator cell as an input beam of the second confocal resonator cell.

41. The apparatus of claim 36 further comprising: each of the plurality of confocal resonators comprises a first concave spherical mirror having a radius of curvature and a second concave spherical mirror having the same radius of curvature and separated by the radius of curvature.

42. The apparatus of claim 41 further comprising: the pulse stretcher comprising a first confocal resonator cell comprising: a first concave spherical mirror having a radius of curvature receiving an input beam from the laser output pulse optical delay initiating optic comprising the portion of the output laser pulse at a first point on a face of the first concave spherical mirror and generating a first reflected beam; a second concave spherical mirror having the same radius of curvature and separated from the first concave spherical mirror by the radius of curvature and receiving the first reflected beam at a first point on a face of the second concave spherical mirror and generating a second reflected beam incident on a second point on the face of the first concave spherical mirror, the second reflected beam being reflected by the first concave spherical mirror from the second point on the first mirror to form an output beam from the first confocal resonator cell; and, a second confocal resonator cell receiving the output beam of the first confocal resonator cell as an input beam of the second confocal resonator cell.

43. A high peak power short pulse duration gas discharge laser system producing a laser output pulse comprising: a pulse stretcher means comprising: a laser output pulse optical delay initiating optic diverting a portion of the output laser pulse into an optical delay having an optical delay path and comprising: a plurality of confocal resonators in series aligned to deliver the output of the optical delay to the laser output pulse optical delay initiating optic; and a first confocal resonator cell means of the plurality of confocal resonators comprising: a first concave spherical mirror means having a radius of curvature for receiving an input beam from the laser output pulse optical delay initiating means comprising the portion of the output laser pulse at a first point on a face of the first concave spherical mirror means and for generating first reflected beam; a second concave spherical mirror means having the same radius of curvature and separated from the first concave spherical mirror means by the radius of curvature for receiving the first reflected beam at a first point on a face of the second concave spherical mirror means and for generating a second reflected beam incident on a second point on the face of the first concave spherical mirror means, the second reflected beam being reflected by the first concave spherical mirror means from the second point on the first mirror to form an output beam from the first confocal resonator cell; and, a second confocal resonator cell mean for receiving the output beam of the first confocal resonator cell means as an input beam of the second confocal resonator cell means.

44. The apparatus of claim 43 further comprising: the plurality of confocal resonator means comprises four confocal resonator means comprising a twelve pass four mirror arrangement.

45. The apparatus of claim 44 further comprising: each of the plurality of confocal resonator means comprises a first concave spherical mirror having a radius of curvature and a second concave spherical mirror having the same radius of curvature and separated by the radius of curvature.

46. The apparatus of claim 45 further comprising: the pulse stretcher means comprising a first confocal resonator cell means comprising: a first concave spherical mirror means having a radius of curvature for receiving an input beam from the laser output pulse optical delay initiating means comprising the portion of the output laser pulse at a first point on a face of the first concave spherical mirror means and for generating a first reflected beam; a second concave spherical mirror means having the same radius of curvature and separated from the first concave spherical mirror means by the radius of curvature for receiving the first reflected beam at a first point on a face of the second concave spherical mirror means and for generating a second reflected beam incident on a second point on the face of the first concave spherical mirror means, the second reflected beam being reflected by the first concave spherical mirror means from the second point on the first mirror to form an output beam from the first confocal resonator cell; and, a second confocal resonator cell means for receiving the output beam of the first confocal resonator cell means as an input beam of the second confocal resonator cell means.

47. The apparatus of claim 44 further comprising: the pulse stretcher means comprising a first confocal resonator cell means comprising: a first concave spherical mirror means having a radius of curvature for receiving an input beam from the laser output pulse optical delay initiating means comprising the portion of the output laser pulse at a first point on a face or the first concave spherical mirror means and for generating a first reflected beam; a second concave spherical mirror means having the same radius of curvature and separated from the first concave spherical mirror means by the radius of curvature for receiving the first reflected beam at a first point on a face of the second concave spherical mirror means and for generating a second reflected beam incident on a second point on the face of the first concave spherical mirror means, the second reflected beam being reflected by the first concave spherical mirror means from die second point on the first mirror to form an output beam from the first confocal resonator cell; and, a second confocal resonator cell means for receiving the output beam of the first confocal resonator cell means as an input beam of the second confocal resonator cell means.

48. The apparatus of claim 43 further comprising: each of the plurality of confocal resonator means comprises a first concave spherical mirror having a radius of curvature and a second concave spherical mirror having the same radius of curvature and separated by the radius of curvature.

49. The apparatus of claim 48 further comprising: the pulse stretcher means comprising a first confocal resonator cell means comprising: a first concave spherical mirror means having a radius of curvature for receiving an input beam from the laser output pulse optical delay initiating means comprising the portion of the output laser pulse at a first point on a face of the first concave spherical mirror means and for generating a first reflected beam; a second concave spherical mirror means having the same radius of curvature and separated from the first concave spherical mirror means by the radius of curvature for receiving the first reflected beam at a first point on a face of the second concave spherical mirror means and for generating a second reflected beam incident on a second point on the face of the first concave spherical mirror means, the second reflected beam being reflected by the first concave spherical mirror means from the second point on the first mirror to form an output beam from the first confocal resonator cell; and, a second confocal resonator cell means for receiving the output beam of the first confocal resonator cell means as an input beam of the second confocal resonator cell means.

50. A high peak power short pulse duration gas discharge laser system producing a laser output pulse comprising: a beam delivery unit means comprising:
   a laser output pulse optical delay initiating optic diverting a portion of the output laser pulse into an optical delay having an optical delay path and comprising:
   a plurality of confocal resonators in series aligned to deliver the output of the optical delay to the laser output pulse optical delay initiating optic; and
   a first confocal resonator cell means of the plurality of confocal resonators comprising: a first concave spherical mirror means having a radius of curvature for receiving an input beam from the laser output pulse optical delay initiating means comprising the portion of the output laser pulse at a first point on a face of the first concave spherical mirror means and for generating a first reflected beam; a second concave spherical mirror means having the same radius of curvature and separated from the first concave spherical mirror means by the radius of curvature for receiving the first reflected beam at a first point on a face of the second concave spherical mirror means and for generating a second reflected beam incident on a second point on the face of the first concave spherical mirror means, the second reflected beam being reflected by the first concave spherical mirror means from the second point on the first mirror to form an output beam from the first confocal resonator cell; and, a second confocal resonator cell means for receiving the output beam of the first confocal resonator cell means as an input beam of the second confocal resonator cell means.

51. The apparatus of claim 50 further comprising: the plurality of confocal resonator means comprises four confocal resonator means comprising a twelve pass four mirror arrangement.

52. The apparatus of claim 51 further comprising: each of the plurality of confocal resonator means comprises a first concave spherical mirror having a radius of curvature and a second concave spherical mirror having the same radius of curvature and separated by the radius of curvature.

53. The apparatus of claim 52 further comprising: the pulse stretcher means comprising a first confocal resonator cell means comprising: a first concave spherical mirror means having a radius of curvature for receiving an input beam from the laser output pulse optical delay initiating means comprising the portion of the output laser pulse at a first point on a face of the first concave spherical mirror means and for generating a first reflected hewn; a second concave spherical mirror means having the same radius of curvature and separated from the first concave spherical mirror means by the radius of curvature for receiving the first reflected beam at a first point on a face of the second concave spherical mirror means and for generating a second reflected beam incident on a second point on the face of the first concave spherical mirror means, the second reflected beam being reflected by the first concave spherical mirror means from the second point on the first mirror to form an output beam from the first confocal resonator cell; and, a second confocal resonator cell means for receiving the output beam of the first confocal resonator cell means as an input beam of the second confocal resonator cell means.

54. The apparatus of claim 51 further comprising: the pulse stretcher means comprising a first confocal resonator cell means comprising: a first concave spherical mirror means having a radius of curvature for receiving an input beam from the laser output pulse optical delay initiating means comprising the portion of the output laser pulse at a first point on a face of the first concave spherical mirror means and for generating a first reflected beam; a second concave spherical mirror means having the same radius of curvature and separated from the first concave spherical mirror means by the radius of curvature for receiving the first reflected beam at a first point on a face of the second concave spherical mirror means and for generating a second reflected beam incident on a second point on the face of the first concave spherical mirror means, the second reflected beam being reflected by the first concave spherical mirror means from the second point on the first mirror to form an output beam from the first confocal resonator cell; and, a second confocal resonator cell means for receiving the output beam of first confocal resonator cell means as an input beam of the second confocal resonator cell means.

55. The apparatus of claim 50 further comprising: each of the plurality of confocal resonator means comprises a first concave spherical mirror having a radius of curvature and a second concave spherical mirror having the same radius of curvature and separated by the radius of curvature.

56. The apparatus of claim 55 further comprising: the pulse stretcher means comprising a first confocal resonator cell means comprising; a first concave spherical mirror means having a radius of curvature for receiving an input beam from the laser output pulse optical delay initiating means comprising the portion of the output laser pulse at a first point on a face of the first concave spherical mirror means and for generating a first reflected beam; a second concave spherical mirror means having the same radius of curvature and separated from the first concave spherical mirror means by the radius of curvature for receiving the first reflected beam at a first point on a face of the second concave spherical mirror means and for generating a second reflected beam incident on a second point on the thee of the first concave spherical mirror means, the second reflected beam being reflected by the first concave spherical mirror means from the second point on the first mirror to form an output beam from the first confocal resonator cell; and, a second confocal resonator cell means for receiving the output beam of the first confocal resonator cell means as an input beam of the second confocal resonator cell means.

57. A method of providing a high peak power short pulse duration gas discharge laser output pulse comprising: stretching the output pulse by diverting a portion of the output laser pulse into an optical delay path comprising: a plurality of confocal resonators in series delivering the output of the optical delay path to the laser output pulse optical delay initiating optic and combining it with the laser output pulse; and utilizing a first confocal resonator cell of the plurality of confocal resonators comprising: a first concave spherical mirror means having a radius of curvature for receiving an input beam from the laser output pulse optical delay initiating means comprising the portion of the output laser pulse at a first point on a face of the first concave spherical mirror means and for generating a first reflected beam; second concave spherical mirror means having the same radius of curvature and separated from the first concave spherical mirror means by the radius of curvature for receiving the first reflected at a first point on a face of the second concave spherical mirror means and for generating a second reflected beam incident on a second point on the face of the first concave spherical mirror means, the second reflected beam being reflected by the first concave spherical mirror means from the second point on the first mirror to font an output beam from the first confocal resonator cell; and, a second confocal resonator cell means for receiving the output beam of the first confocal resonator cell means as an input beam of the second confocal resonator cell means.

58. The method of claim 57 further comprising: the plurality of confocal resonators comprises four confocal resonators comprising a twelve pass four mirror arrangement.

59. The method of claim 58 further comprising: each of the plurality of confocal resonators comprises a first concave spherical mirror having a radius of curvature and a second concave spherical mirror having the same radius of curvature and separated by the radius of curvature.

60. The method of claim 59 further comprising: the pulse stretching steps comprising utilizing a first confocal resonator cell comprising: a first concave spherical mirror means having a radius of curvature for receiving an input beam from the laser output pulse optical delay initiating means comprising the portion of the output laser pulse at a first point on a face of the first concave spherical mirror means and for generating a first reflected beam; a second concave spherical mirror means having the same radius of curvature and separated from the first concave spherical mirror means by the radius of curvature for receiving the first reflected beam at a first point on a face of the second concave spherical mirror means and for generating a second reflected beam incident on a second point on the face of the first concave spherical mirror means, the second reflected beam being reflected by the first concave spherical mirror means from the second point on the first mirror to form an output beam from the first confocal resonator cell; and, a second confocal resonator cell means for receiving the output beam of the first confocal resonator cell means as an input beam of the second confocal resonator cell means.

61. The method of claim 58 further comprising: the pulse stretching steps comprising utilizing a first confocal resonator cell comprising: a first concave spherical mirror means having a radius of curvature for receiving an input beam from the laser output pulse optical delay initiating means comprising the portion of the output laser pulse at a first point on a face of the first concave spherical mirror means and for generating a first reflected beam; a second concave spherical mirror means having the same radius of curvature and separated from the first concave spherical mirror means by the radius of curvature for receiving the first reflected beam, at a first point on a face of the second concave spherical mirror means and for generating a second reflected beam incident on a second point on the face of the first concave spherical mirror means, the second reflected beam being reflected by the first concave spherical mirror means from the second point on the first mirror to form an output beam from the first confocal resonator cell; and, a second confocal resonator cell means for receiving the output beam of the first confocal resonator cell means as an input beam of the second confocal resonator cell means.

62. The method of claim 57 further comprising: each of the plurality of confocal resonators comprises a first concave spherical mirror having a radius of curvature and a second concave spherical mirror having the same radius of curvature and separated by the radius of curvature.

63. The method of claim 62 further comprising: the pulse stretching steps comprising utilizing a first confocal resonator cell comprising: a first concave spherical mirror means having a radius of curvature for receiving an input beam from the laser output pulse optical delay initiating means comprising the portion of the output laser pulse at a first point on a face of the first concave spherical mirror means and for generating a first reflected beam; a second concave spherical mirror means having the same radius of curvature and separated from the first concave spherical mirror means by the radius of curvature for receiving the first reflected beam at a first point on a face of the second concave spherical mirror means and for generating a second reflected beam incident on a second point on the face of the first concave spherical mirror means, the second reflected beam being reflected by the first concave spherical mirror means from the second point on the first mirror to form an output beam from the first confocal resonator cell; and, a second confocal resonator cell means for receiving the output beam of the first confocal resonator cell means as an input beam of the second confocal resonator cell means.

64. A high peak power short pulse duration gas discharge laser system producing a laser output pulse comprising: a first pulse stretcher comprising: a first laser output pulse optical delay initiating optic diverting a portion of the output laser pulse into a first optical delay having an optical delay path and comprising: a first plurality of confocal resonators in series aligned to deliver the output of the first optical delay to the first laser output pulse optical delay initiating optic;
 a first confocal resonator cell of the first plurality of confocal resonators comprising; a first concave spherical mirror having a radius of curvature receiving an input beam from the laser output pulse optical delay initiating optic comprising the portion of the output laser pulse at a first point on a face of the first concave spherical mirror and generating a first reflected beam; a second concave spherical mirror having the same radius of curvature and separated from the first concave spherical mirror by the radius of curvature and receiving the first reflected beam at a first point on a face of the second concave spherical mirror and generating a second reflected beam incident on second point on the face of the first concave spherical mirror, the second reflected beam being reflected by the first concave spherical mirror from the second point on the first mirror to form an output beam from the first confocal resonator cell; a second confocal resonator cell receiving the output beam of the first confocal resonator cell as an input beam of the second confocal resonator cell; and a second pulse stretcher comprising: a second laser output pulse optical delay initiating optic diverting a portion of the output of the first optical delay into a second optical delay having an optical delay path and comprising: a second plurality of confocal resonators in series aligned to deliver the output of the second optical delay to the second laser output pulse optical delay initiating optic.

65. A high peak power short pulse duration gas discharge laser system producing a laser output pulse comprising a pulse stretcher comprising: a laser output pulse optical delay initiating optic diverting a spatially contiguous portion of the output laser pulse into an optical delay having an optical delay path and comprising:
 a plurality of confocal resonators in series aligned to deliver the output of the optical delay to the laser output pulse optical delay initiating optic; and
 a first confocal resonator cell comprising: a first concave spherical mirror having a radius of curvature receiving an input beam from the laser output pulse optical delay initiating optic comprising the portion of the output laser pulse at a first point on a face of the first concave spherical mirror and generating a first reflected beam; a second concave spherical mirror having the same radius of curvature and separated from the first concave spherical mirror by the radius of curvature and receiving the first reflected beam at a first point on a face of the second concave spherical mirror and generating a second reflected beam incident on a second point on the face of the first concave spherical mirror, the second reflected beam being reflected by the first concave spherical mirror from the second point on the first mirror to form an output beam from the first confocal resonator cell: and, a second confocal resonator cell receiving the output beam of the first confocal resonator cell as input beam the second confocal resonator cell.

* * * * *